United States Patent
Tanaka

(10) Patent No.: US 9,608,405 B2
(45) Date of Patent: Mar. 28, 2017

(54) LASER DRIVER WITH MAINTAINING AVERAGE OPTICAL POWER CONSTANT

(71) Applicant: SUMITOMO ELECTRIC INDUSTRIES, LTD., Osaka-shi, Osaka (JP)

(72) Inventor: Keiji Tanaka, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/195,076

(22) Filed: Jun. 28, 2016

(65) Prior Publication Data

US 2017/0012406 A1   Jan. 12, 2017

(30) Foreign Application Priority Data

Jul. 7, 2015 (JP) ................... 2015-136168

(51) Int. Cl.
| | |
|---|---|
| *H01S 3/00* | (2006.01) |
| *H01S 5/042* | (2006.01) |
| *H01S 5/062* | (2006.01) |
| *H01S 3/091* | (2006.01) |
| *H01S 5/026* | (2006.01) |

(52) U.S. Cl.
CPC ............ *H01S 5/042* (2013.01); *H01S 3/0912* (2013.01); *H01S 5/0261* (2013.01); *H01S 5/06203* (2013.01)

(58) Field of Classification Search
CPC ...... H01S 5/042; H01S 3/0912; H01S 5/0261; H01S 5/06203
See application file for complete search history.

(56) References Cited

U.S. PATENT DOCUMENTS

| | | | |
|---|---|---|---|
| 2008/0240739 A1* | 10/2008 | Tanaka ................ | H03F 3/082 398/202 |
| 2009/0238226 A1 | 9/2009 | Moto et al. | |
| 2010/0092184 A1 | 4/2010 | Nguyen et al. | |
| 2010/0135675 A1* | 6/2010 | Tanaka ................ | H01S 5/06213 398/192 |
| 2010/0254713 A1* | 10/2010 | Tanaka ................ | H01S 5/042 398/182 |
| 2011/0164636 A1* | 7/2011 | Tanaka ................ | H01S 5/0428 372/38.02 |

(Continued)

*Primary Examiner* — Yuanda Zhang
(74) *Attorney, Agent, or Firm* — Global IP Counselors, LLP

(57) ABSTRACT

The laser driver including a difference amplifier, a target potential circuit, an adjusting circuit, and bypass circuit is disclosed. The differential amplifier outputs a driving signal and a reverse driving signal having a phase opposite to a phase of the driving signal. The bypass circuit outputs an output current in response to the driving signal for generating a driving current for a semiconductor laser element that emits an optical signal in response to the driving signal. The adjusting circuit controls average potential of the driving signal and the reverse driving signal, so that the average potential becomes substantially equal to a target potential provided by the target potential circuit. The target potential corresponds to average optical power of the optical signal. When amplitude of the driving signal is changed for adjusting an extinction ratio of the optical signal, the adjusting circuit maintains the average optical power in a constant value.

6 Claims, 11 Drawing Sheets

(56) References Cited

U.S. PATENT DOCUMENTS

2013/0229231 A1* 9/2013 Tanaka .................. H03F 3/4508
330/254
2014/0132348 A1* 5/2014 Itabashi .................... H03F 1/22
330/261

* cited by examiner

LASER DRIVER WITH MAINTAINING AVERAGE OPTICAL POWER CONSTANT

CROSS-REFERENCE TO RELATED APPLICATIONS

This U.S. National stage application claims priority under 35 U.S.C. §119(a) to Japanese Patent Application No. 2015-136168, filed in Japan on Jul. 7, 2015, the entire contents of which are hereby incorporated herein by reference.

FIELD OF THE INVENTION

The present invention relates to a laser driver, and more specifically to a laser driver that drives a semiconductor laser element for optical fiber communication systems.

DESCRIPTION OF THE RELATED ART

US Patent Application 2010/0092184 discloses an optical transmitter with a built-in laser driving circuit. The laser driving circuit includes a pair of transistors that operates in response to a differential input signal, and generates a driving signal by converting a current signal output from one of the transistors into a voltage signal with a resistive element. The other of the transistors is connected in series with a cathode of a semiconductor laser and receives at a control terminal thereof the driving signal through a emitter follower.

SUMMARY OF THE INVENTION

According to an aspect of the present invention, there is provided a laser driver for generating a driving current for a semiconductor laser element in response to a differential input signal. The semiconductor laser element receives a direct current from a direct current source connected in series with the semiconductor laser element. The laser driver includes a differential amplifier, a target potential circuit, an adjusting circuit, a bypass circuit. The differential amplifier includes an upper node, a lower node connected to a reference potential line, a first current source to provide a first source current flowing in the lower node, a pair of first resistors, and a pair of first transistors. Each of the first resistors has a first end and second end. The respective first ends of the first resistors are connected with the upper node. The second end of one of the first resistors outputs a driving signal. The second end of another of the first resistors outputs a reverse driving signal, which has a phase opposite to a phase of the driving signal. A pair of the first transistors is configured to divide the first source current into a first current and a second current in response to the differential input signal. The first current flows in the second end of the one of the paired resistors. The second current flows in the second end of the another of the first resistors. The target potential circuit is configured to generate a target potential. The adjusting circuit includes a variable resistor connected between a power supply line and the upper node of the differential amplifier. The adjusting circuit is configured to adjust resistance of the variable resistor so as to reduce difference between the target potential and a center potential between the driving signal and the reverse driving signal. The bypass circuit is connected in parallel with the semiconductor laser element. The bypass circuit is configured to output an output current in response to the driving signal. The driving current is generated by subtracting the output current from the direct current.

The laser driver according to the embodiment of the present invention may enable adjustment of an extinction ratio of the optical signal by changing amplitude of the driving signal and at the time maintain the average optical power in a constant, when the differential input signal has an amplitude greater than the linear operation region of the differential amplifier.

DESCRIPTION OF THE PREFERRED EMBODIMENTS

Figure 1:
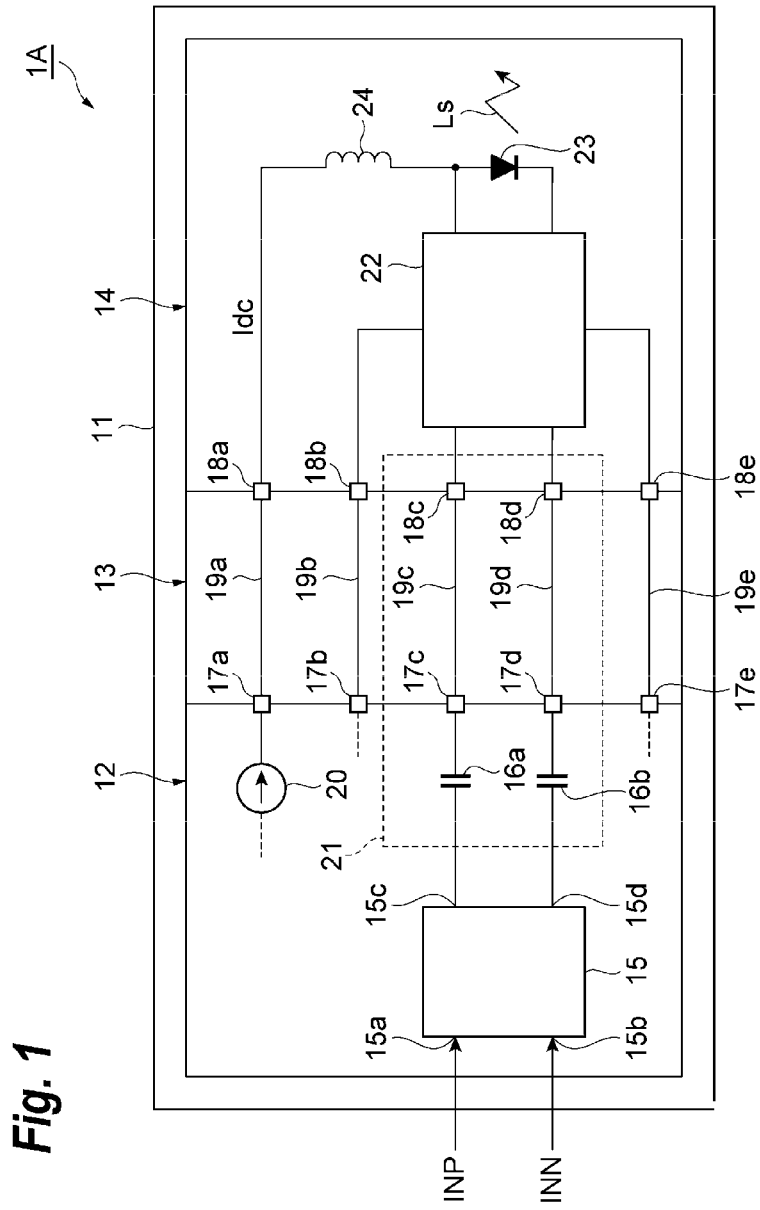
FIG. 1 is a block diagram of an optical transmitter according to an embodiment of the present invention.

Hereinafter, a laser driver according to an embodiment of the present invention will be described in detail with reference to the attached drawings. Note that the same components in the description of the drawings are indicated by the same reference numerals, and overlapping descriptions are omitted.

FIG. 1 is a block diagram of an optical transmitter according to an embodiment of the present invention. As illustrated in FIG. 1, the optical transmitter 1A includes a housing 11, a printed circuit board (PCB) 12, a flexible printed circuit (FPC) 13, and a Transmitter Optical Sub-Assembly (TOSA) 14. The housing 11 contains the PCB 12, the FPC 13, and the TOSA 14. In the housing 11, one side of the PCB 12 and one side of the FPC 13 are electrically connected to each other through terminals 17a to 17e. Then, the other end of the FPC 13 and one end of the TOSA 14 are electrically connected to each other through terminals 18a to 18e. In the FPC 13, the terminal 17a to 17e are electrically connected with the terminals 18a to 18e though interconnections 19a to 19e, respectively.

The PCB 12 includes a CDR 15, coupling capacitors 16a, 16b, and a constant current source 20. The CDR 15 receives a differential input signal from an outside of the optical transmitter 1A at a pair of input terminals 15a, 15b. The differential input signal consists of a positive-phase input signal INP and a negative-phase input signal INN. The negative-phase input signal INN has a phase opposite to a phase that the positive-phase input signal INP has. The CDR 15 reshapes waveforms of the positive-phase input signal INP and the negative-phase input signal INN, and outputs the respective reshaped signals thereof from a pair of output terminals 15c, 15d. The output terminal 15c is electrically connected with one electrode of the coupling capacitor 16a. The output terminal 15d is also electrically connected with one electrode of the coupling capacitor 16b. Another electrode of the coupling capacitor 16a is electrically connected with the terminal 17c. Another electrode of the coupling capacitor 16b is also electrically connected with the terminal 17d. The reshaped signals are propagated to a laser driver 22 (described in detail later) in the TOSA 14 thorough the terminals 17c, 17d, the interconnections 19c, 19d, and the terminals 18c, 18d. The electrical elements coupled between the CDR 15 and the laser driver 22 constitutes a transmission line 21 for transmitting high frequency signals.

Hereat, transmission rate of optical communication systems has been reaching, for example, 28 Gbit/s. To enable optical transmitters having such high speed performance, speed-up of inside electrical signals like, for example, differential input signal is needed. High speed electrical signals, however, easily deteriorate, when they goes through a PCB, an FPC, and electrical connectors, because of conductive loss and dielectric loss thereof. The CDR 15 reshapes and reproduces waveforms of deteriorated electrical signals coming from the outside, but the improved electrical signals often deteriorate again while they are traveling from the CDR 15 to the TOSA 14. Probably, adding another CDR just before the TOSA will not be a solution, because even a short-length signal line between the added CDR and the TOSA may deteriorate the high-speed signals again.

When the differential input signal has an amplitude greater than the linear operation region of the differential amplifier, the waveforms of the output signal are improved by the laser driver, because overshoots and undershoots being out of the linear operation region are clipped from the waveforms. However, in such a driving system, change in amplitude of the driving signal causes change in the average optical power of the optical signal. Accordingly, an additional control circuit may maintain the average optical power constant, when the amplitude of the driving signal is changed. However, such control circuit will be complicated and need more electrical parts and larger area for mounting the whole circuit. Therefore, simple configuration is more preferable for downsizing of the optical transmitters.

This invention has been considered to solve the aforementioned issue. When the differential input signal has amplitude greater than the linear operation region of the laser driver, the laser driver according to the embodiment of the present invention may enable adjustment of an extinction ratio of the optical signal by changing amplitude of the driving signal with simultaneously maintaining the average optical power in a constant value.

The constant current source 20 provides a constant current (direct current) Idc to a laser diode 23 (semiconductor laser element) installed in the TOSA 14. The constant current source 20 is electrically connected with the terminal 17a. The constant current Idc is provided to the laser diode 23 through the terminal 17a, the interconnection 19a, and the terminal 18a.

The terminal 17b is electrically connected with a power supply line included in the PCB 12. A supply voltage is provided to the laser driver 22 in the TOSA 14 through the terminal 17b, the interconnection 19b, and the terminal 18b. The terminal 17e is electrically connected with a reference potential line (GND line) included in the PCB 12. Reference potential is provided to the laser driver 22 in the TOSA 14 through the terminal 17e, the interconnection 19e, and the terminal 18e.

The TOSA 14 includes a laser driver 22, a laser diode 23, and a ferrite bead 24 (inductor). The laser driver 22 is an electrical circuit to drive the laser diode 23 in a shunt driving system.

The laser driver 22 receives the positive-phase input signal INP and the negative-phase input signal INN through the terminals 18c, 18d, and modulates a current that flows in the laser diode 23 in response to a difference between the positive-phase input signal INP and the negative-phase input signal INN by subtracting an output current from the constant current Idc. As aforementioned, the laser driver 22 receives the supply voltage through the terminal 18b, and the reference potential through the terminal 18e. A supply current flows from the terminal 18b to the terminal 18e through the laser driver 22. The laser driver 22 consumes an electrical power, which corresponds to a product of the power supply voltage and the supply current.

The laser diode 23 is electrically connected with the constant current source 20 through the terminal 18a, and receives the constant current Idc when the laser driver 22 outputs no current. When the laser driver 22 outputs an output current, which flows from the constant current source 20 into the laser driver 22, the laser diode 23 is driven by a current produced by subtracting the output current from the constant current Idc. Accordingly, the laser driver 22 modulates an optical signal Ls emitted from the laser diode 23 by switching the output current. The optical signal Ls is transmitted to the outside through an optical fiber, one end of which is connected with the TOSA 14.

The inductor 24 is electrically connected between the terminal 18a and an anode of the laser diode 23. Although, in low frequencies, the inductor 24 passes the constant current Idc, in high frequencies, the inductor 24 prevents high frequency components (noises) from passing from the laser driver 22 to the terminal 18a and vice versa.

Figure 2:
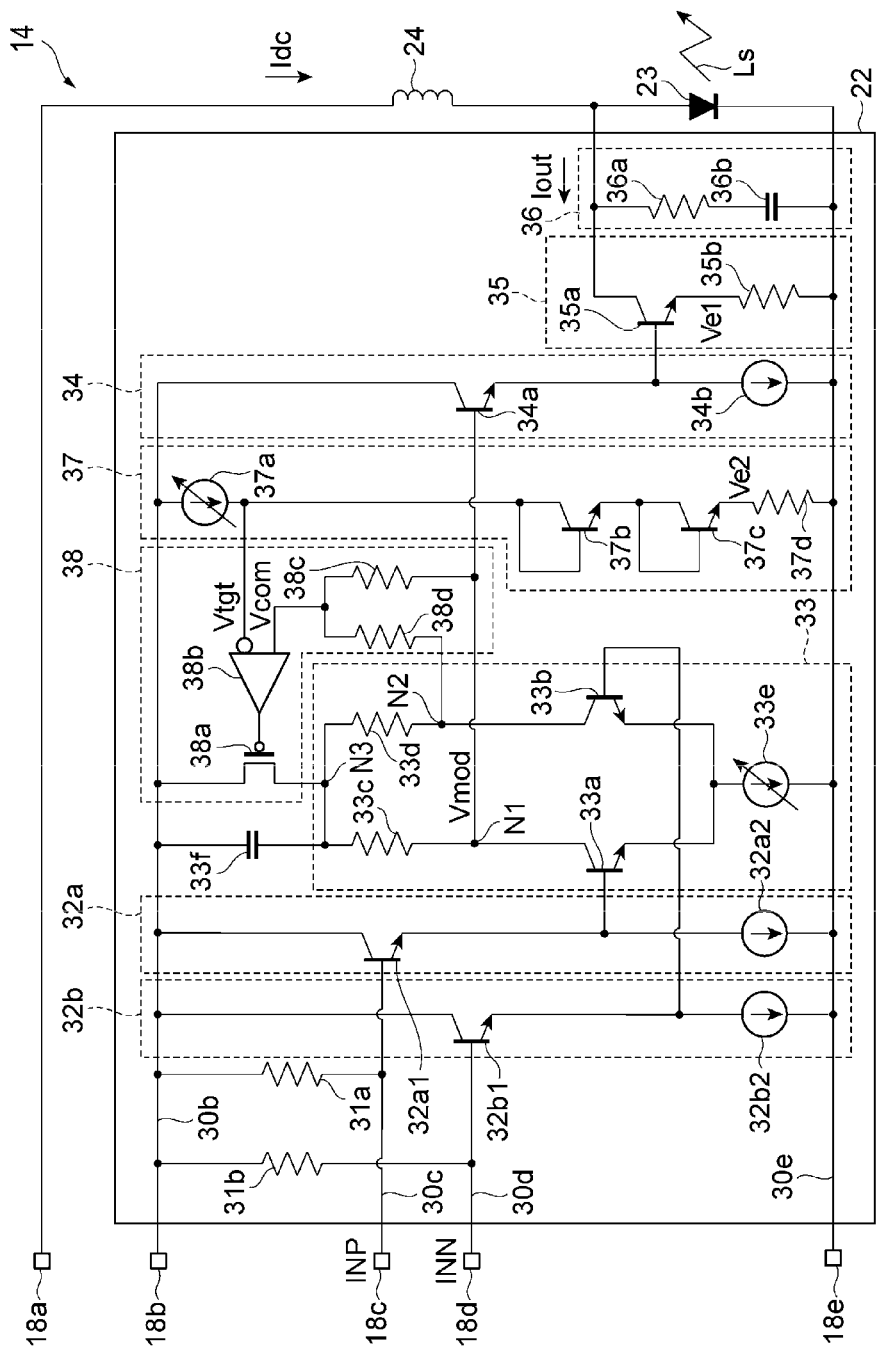
FIG. 2 is a circuit diagram of a laser driver according to the embodiment of the present invention.

FIG. 2 is a circuit diagram of the laser driver 22 according to the embodiment of the present invention. As illustrated in FIG. 2, the laser driver 22 includes a pair of termination resistors 31a, 31b, a pair of input-side emitter followers 32a, 32b, a differential amplifier 33, an output-side emitter follower 34, a bypass circuit 35, a filter 36, a target potential circuit 37, and an adjusting circuit 38.

The termination resistor 31a is connected between a power supply line 30b and an interconnection 30c of the positive-phase input signal INP. The power supply line 30b is extended from the terminal 18b. The termination resistor 31b is connected between the power supply line 30b and an interconnection 30d of the negative-phase input signal INN. The termination resistor 31a is set up to suppress reflection of high frequency components in the positive-phase input signal INP by consuming electrical energy thereof. Also, the termination resistor 31b is set up to suppress reflection of high frequency components in the negative-phase input signal INN by consuming electrical energy thereof. For example, the respective termination resistors 31a, 31b have resistance of 50 ohm to match characteristics impedance of the transmission lines configured in the PCB 12 and FPC 13.

The input-side emitter followers 32a, 32b are set up to prevent the positive-phase input signal INP and the negative-phase input signal INN from reflecting by separating capacitive loads of input terminals of the differential amplifier 33 from the interconnections 30c, 30d. Specifically, the input-side emitter follower 32a includes a transistor 32a1 and a constant current source 32a2. The transistor 32a1 is, for example, an NPN-type bipolar transistor. A control terminal (base) of the transistor 32a1 is connected with the positive signal line 30c. A first current terminal (collector) of the transistor 32a1 is connected with the power supply line 30b, and a second current terminal (emitter) of the transistor 32a1 is connected with a first end of the constant current source 32a2. A second end of the constant current source 32a2 is connected with the reference potential line 30e (GND line) extending from the terminal 18e. Similarly, the input-side emitter follower 32b includes a transistor 32b1 and a constant current source 32b2. The transistor 32b1 is, for example, an NPN-type bipolar transistor. A control terminal (base) of the transistor 32b1 is connected with the negative signal line 30d. A first current terminal (collector) of the transistor 32b1 is connected with the power supply line 30b, and a second current terminal (emitter) of the transistor 32b1 is connected with a first end of the constant current source 32b2. A second end of the constant current source 32b2 is connected with the reference potential line 30e (GND line).

The differential amplifier 33 includes a variable current source 33e (first current source), a pair of transistors 33a, 33b (first transistors) each connected in series with the variable current source 33e, a pair of resistors 33c, 33d (first resistors) connected with the transistors 33a, 33b, respectively. In the differential amplifier 33, a pair of the transistors 33a, 33b receives the differential input signal (the positive-phase input signal INP and the negative-phase input signal INN) from the input-side emitter followers 32a, 32b, and generates a differential output signal in response to the differential input signal. In other words, the transistor 33a and the resistor 33c constitute a first series circuit and the transistor 33b and the resistor 33d constitute a second series circuit. The differential amplifier 33 includes a parallel circuit in which the first series circuit and the second series circuit are connected to each other in parallel. The transistors 33a, 33b are examples of first transistors according to the embodiment of the present invention. The resistors 33c, 33d are examples of first resistors according to the embodiment of the present invention. The variable current source 33e is an example of a first current source according to the embodiment of the present invention. The transistors 33a, 33b are, for example, NPN-type bipolar transistors.

Specifically, the control terminal (base) of the transistor 33a is connected with an output terminal of the input-side emitter follower 32a, namely a node between the second current terminal (emitter) of the transistor 32a1 and the constant current source 32a2. Similarly, the control terminal (base) of the transistor 33b is connected with an output terminal of the input-side emitter follower 32b, namely a node between the second current terminal (emitter) of the transistor 32b1 and the constant current source 32b2. The first current terminals (collectors) of the transistor 33a, 33b are connected with first ends of the resistors 33c, 33d, respectively. The second current terminals (emitters) of the transistors 33a, 33b are connected to each other, and further connected with the first current source 33e.

The second ends of the resistor 33c, 33d are connected to each other and further connected with the power supply line 30b through the transistor 38a. For example, the resistors 33c, 33d have the same resistance. A bypass capacitor 33f is connected between the power supply line 30b and the second ends of the resistors 33c, 33d, in parallel with the transistor 38a. This configuration allows an AC signal (or high frequency components thereof) at the second ends of the resistors 33c, 33d to be grounded to the power supply line 30b.

The variable current source 33e (first current source) is connected between the reference potential line 30e and a node connected with the second current terminals (emitters) of the transistors 33a, 33b. The variable current source 33e regulates a current flowing through the pair of the series circuits described above.

As described above, the differential amplifier 33 generates the differential output signal. The differential amplifier 33 according to the embodiment of the present invention outputs one of paired signals that constitute the differential output signal, namely a driving signal Vmod generated from a voltage drop of a resistor (for example, the resistor 33c) included in one of the paired series circuits. Accordingly, an output terminal of the differential amplifier 33 is set to a node N1 between the first current terminal (collector) of the transistor 33a and the resistor 33c.

The output-side emitter follower 34 separates capacitive load of an input terminal of the bypass circuit 35 (shunt circuit) from the output terminal (the node N1) of the differential amplifier 33. Specifically, the output-side emitter follower 34 includes a transistor 34a and a current source 34b. The transistor 34a is, for example, an NPN-type bipolar transistor. A control terminal (base) of the transistor 34a is connected with the output terminal of the differential amplifier 33, namely the node N1. A first current terminal (collector) of the transistor 34a is connected with the power supply line 30b, and a second current terminal (emitter) of the transistor 34a is connected with a first end of the constant current source 34b. A second end of the constant current source 34b is connected with the reference potential line 30e.

The bypass circuit 35 is connected in parallel with the laser diode 23. The bypass circuit 35 receives the driving signal Vmod through the output-side emitter follower 34 and modulates a current flowing in the laser diode 23 by subtracting a bypass current, which is a part of the constant current Idc and proportional to the driving signal Vmod. Specifically, the bypass circuit 35 includes a transistor 35a (second transistor) operating in response to the driving signal Vmod and resistor 35b (second resistor) connected in series with the transistor 35a. The transistor 35a is, for example, an NPN-type bipolar transistor. A control terminal (base) of the transistor 34a is connected with a node between the second current terminal (emitter) of the transistor 34a and the constant current source 34b. A first current terminal (collector) of the transistor 35a is connected with a node (connection point) between the inductor 24 and an anode of the laser diode 23. A second current terminal (emitter) of the transistor 35a is connected with the reference potential line 30e through the resistor 35b. The bypass current (shunt current) flows from the first current terminal (collector) to the second current terminal (emitter) of the transistor 35a. Accordingly, change of the driving signal Vmod causes change of a voltage applied to the control terminal (base) of the transistor 35a. The bypass current changes in response to the voltage applied to the control terminal (base) of the transistor 35a.

The filter 36 is connected in parallel with the laser diode 23 and removes high frequency noises. Specifically, the filter 36 includes a resistor 36a and capacitor 36b. A first end of the resistor 36a is connected with the node (connection point) between the inductor 24 and the laser diode 23, and a second end of the resistor 36a is connected with a first electrode of the capacitor 36b. A second electrode of the capacitor 36b is connected with reference potential line 30e.

The target potential circuit 37 generates a target potential Vtgt. Specifically, the target potential circuit 37 includes a current source 37a (second current source), diode connection transistors 37b, 37c, and a resistor 37d (third resistor). The diode connection transistors 37b, 37c replicate the transistors 34a, 35a, respectively. Here, the diode connection transistor means, for example, an NPN-type bipolar transistor with the base and the collector connected to each other, which behaves as a diode. The word "replicate" means that, for example, the diode connection transistor 37b generates a voltage drop equal or close to the base-emitter voltage of the transistor 34a against change in a supply voltage and an ambient temperature. The resistor 37d replicates the resistor 35b: each of the resistors has an identical or similar voltage drop to another. The sizes of the diode connection transistors 37b, 37c may be set equal to the respective sizes of the transistors 34a, 35a multiplied by a factor 1/n, where n is a real number greater than 1. In addition, a resistance of the resistor 37d may be set equal to the resistance of the resistor 35b multiplied by a factor n. The variable current source 37a, the diode connection transistors 37b, 37c, and the resistor 37d are connected in series between the power supply line 30b and the reference potential line 30e, so that an identical current flows through them from the power supply line 30b to the reference potential line 30e. The current source 37a provides the identical current, which may be set substantially equal to the first source current provided by the current source 33e multiplied by the factor 1/n. The target potential Vtgt is generated from a sum of respective voltage drops of the diode connection transistors 37b, 37c, and resistor 37d, and output from a node between the current source 37a and the diode connection transistor 37b.

The diode connection transistor 37b may has characteristics substantially identical to characteristics of the transistor 34a. The diode connection transistor 37c may have characteristics substantially identical to characteristics of the transistor 35a. Although actual individual transistors and resistors may have some variations in characteristics from others, adjusting the variable current source 37a enables the target potential Vtgt to be set to an appropriate value by offsetting the variations.

The adjusting circuit 38 includes a transistor 38a, an operational amplifier 38b, and resistors 38c, 38d. The transistor 38a acts as a variable resistor connected in series with the parallel circuit included in the differential amplifier 33. The transistor 38a is, for example, a p-type MOSFET (Metal-Oxide-Semiconductor Field Effect Transistor). The configuration provides a variable resistor easily. The transistor 38a is connected between the power supply line 30b and the pair of first resistors 33c, 33d. Specifically, a control terminal (gate) of the transistor 38a is connected with an output terminal of the operational amplifier 38b. A first current terminal (source) of the transistor 38a is connected with the power supply line 30b, and a second current terminal (drain) is connected with the first ends of the first resistors 33c, 33d. The resistance between the first and second current terminals of the transistor 38a changes in response to the output voltage output from the operational amplifier 38b.

As described below, the adjusting circuit 38 adjusts the resistance between the first current terminal (source) and the second terminal (drain) of the transistor 38a, so that an average potential of the differential output signal is maintained equal to the target potential Vtgt. Specifically, a first end of the resistor 38c is connected with a first end of the resistor 38d. The connecting node between the resistors 38c, 38d is connected with a non-inverting input terminal of the operational amplifier 38b. A second end of the resistor 38c is connected with the node N1, and has a potential identical to the potential of the first current terminal (collector) of the transistor 33a. A second end of the resistor 38d is connected with a node N2 between the transistor 33b and the resistor 33d, and has a potential identical to the potential of the first current terminal (collector) of the transistor 33b. When the resistors 38c, 38d have the same resistance, the middle point between the resistors 38c, 38d, which are connected in series between the two nodes N1, N2, provides a center potential of the collector potentials of the transistors 33a, 33b, namely average potential of high level (peak level) and low level (bottom level) of the differential output signal. Therefore, this configuration generates an average potential Vcom of the differential output signal. The average potential Vcom is input to the non-inverting input terminal of the operational amplifier 38b. The resistance of the resistors 38c, 38d is, for example, 10 KΩ. The target potential Vtgt is input to an inverting input terminal of the operational amplifier 38b. In the configuration, the adjusting circuit 38 controls the resistance between the two current terminals (drain and source) of the transistor 38a, so that a potential deference between the average potential Vcom and the target potential Vtgt becomes substantially zero. Accordingly, when the operational amplifier 38b has a sufficient large gain, the feedback control of the variable resistor (the transistor 38a) in the configuration forces the average potential Vcom to be equal to the target potential Vtgt. Meanwhile, a node N3 between the resistors 33c, 33d gives an upper limit for the driving signal Vmod. Thus, when the potential of the node N3 is Vc, the high level (peak level) of the driving signal Vmod becomes Vc. The first current terminal (collector) the transistor 33a gives a lower limit for the driving signal Vmod. When the resistance of the resistor 33c is R33c and the current provided by the variable current source 33e is Imod (adjustment current), the low level (bottom level) of the driving signal Vmod is expressed as Vc−R33c*Imod. Hence, the average potential Vcom is expressed as Vcom=Vc−R33c*Imod/2. Hereat, when the potential at the node N1 (the driving signal Vmod) is the low level, the potential at the node N2 becomes the high level. When the potential at the node N1 (the driving signal Vmod) is the high level, the potential at the node N2 becomes the low level. Therefore, the node N2 provides a signal having a phase opposite to a phase of the driving signal Vmod, which is called a reverse driving signal hereafter.

Figure 3A:
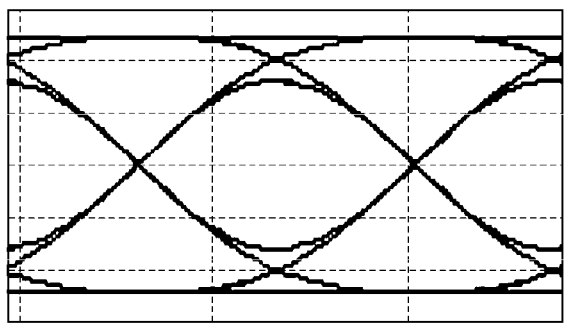
FIG. 3A is an exemplary eye pattern of a deteriorated differential signal that is input from a printed circuit board.
Figure 3B:
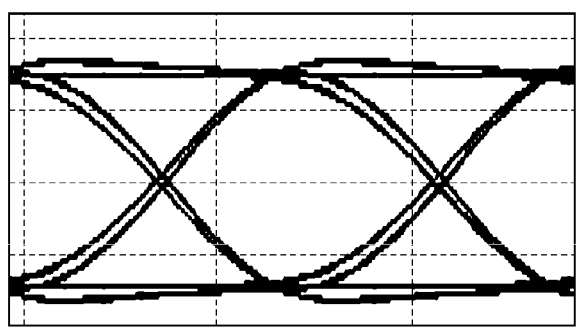
FIG. 3B is an eye pattern of a differential signal improved from the deteriorated differential signal by a CDR (Clock Data Recovery).

The laser driver 22 according to the aforementioned embodiment of the present invention will be described as follows. Suppose that the positive-phase input signal INP and the negative-phase input signal INN, which constitute the differential input signal, have been deteriorated because of the loss during traveling through an external printed circuit board and electrical connectors before they reach the optical transmitter 1A. FIG. 3A is an exemplary eye pattern of such a deteriorated differential signal input from the external printed circuit board. The CDR 15 in the optical transmitter 1A reproduces the deteriorated differential signal and outputs an improved differential signal, an eye pattern of which is illustrated in FIG. 3B.

Figure 3C:
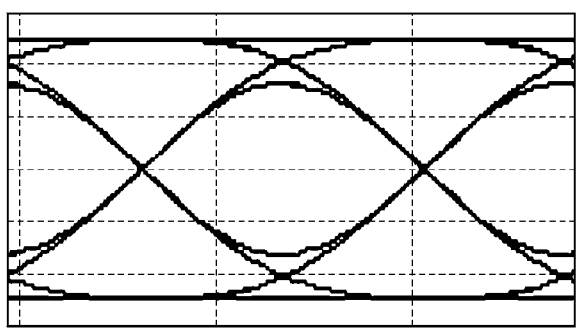
FIG. 3C is an eye pattern of a differential signal deteriorated again from the improved differential signal.

However, the improved differential signal suffers deterioration again while traveling through the transmission line 21 constituted of the PCB 12, the FPC 13, and the coupling capacitors 16a, 16b because of significant loss for very fast transmission speed, for example, 28 Gbit/s. FIG. 3C is an eye pattern of the differential signal deteriorated again from the improved differential signal. The laser driver 22 according to the embodiment of the present invention reshapes the deteriorated differential signal input from the transmission line 21. For the reshaping, amplitude of the positive-phase input signal INP and the negative-phase input signal INN should be set greater than a width of linear operation region, for example, 200 mVppd, of the differential amplifier 33 in the laser driver 22. Such positive-phase input signal INP and negative input signal INN are input to the laser driver 22.

The positive-phase input signal INP and the negative-phase input signal INN pass through the coupling capacitors 16a, 16b, and then enter the input-side emitter followers 32a, 32b, respectively. The input-side emitter follower 32a outputs a level-shifted positive-phase signal, whose potential is lowered from the potential of the positive-phase input signal INP. The input-side emitter follower 32b outputs a level-shifted negative-phase signal, whose potential is lowered from the potential of the negative-phase input signal INN.

The level-shifted positive-phase signal switches the transistor 33a, and the level-shifted negative-phase signal switches the transistor 33b. Actually, the transistors 33a, 33b switch complementarily in response to a potential difference between the level-shifted positive-phase signal and the level-shifted negative-phase signal. When the transistor 33a becomes the ON state and the transistor 33b becomes the OFF state, the current (first source current) provided by the variable current source 33e flows in the resistor 33c and the transistor 33a, and a voltage drop produced at the resistor 33c lowers potential of the node N1. Alternatively, when the transistor 33a becomes the OFF state and the transistor 33b becomes the ON state, the current provided by the variable current source 33e flows in the resistor 33d and the transistor 33b, and a voltage drop produced at the resistor 33d lowers potential of the node N2. At the same time, potential of the node N1 rises. Thus, the potential of the node N1 changes in response to the switching of the transistors 33a, 33b. The logic of the node N1 is inverted from the logic of the positive-phase input signal INP. The differential amplifier 33 output the potential of the node N1, which corresponds to the driving signal Vmod, and generates the potential of the node N2, which corresponds to the reverse driving signal.

The switching of the transistors 33a, 33b depends on the relationship between the positive-phase input signal INP and the negative-phase input signal INN. Namely, when the potential of the positive-phase input signal INP is higher than the potential of the negative-phase input signal INN, the transistor 33a becomes the ON state and the transistor 33b becomes the OFF state. Alternatively, when the potential of the positive-phase input signal INP is lower than the potential of the negative-phase input signal INN, the transistor 33a becomes the OFF state and the transistor 33b becomes the ON state. When the potential of the positive-phase input signal INP is equal to the potential of the negative-phase input signal INN, the both transistors 33a, 33b become an intermediate state between the ON state and the OFF state.

As described above, when the positive-phase input signal INP and the negative-phase input signal INN have an amplitude exceeding the linear operation range of the differential amplifier 33, the high level (peak level) and low level (bottom level) of the driving signal Vmod are limited to constant values because of saturation operation of the differential amplifier 33. Such limiting operation may reshape the differential input signal deteriorated during passing through the PCB 12, the FPC 13, and so on. Thus the differential amplifier 33 outputs the reshaped signal as the driving signal Vmod.

Meanwhile, when the transistor 33a becomes the ON state, the current flowing in the transistor 33a becomes greater than the current flowing in the transistor 33b. The maximum current flowing in the transistor 33a, however, is equal to the current (first source current) provided by the variable current source 33e, namely the adjustment current Imod. Accordingly, amplitude of the voltage drops of the resistors 33c, 33d is limited to a product of the resistance of the transistors 33c, 33d and the current provided by the variable current source 33e. Therefore, potential changes in the positive-phase input signal INP and the negative-phase input signal INN when the amplitude thereof exceeds the linear operation region are cut by the saturation operation of the differential amplifier 33. This allows the driving signal Vmod to have a constant amplitude and stable high and low levels. Change in the current provided by the variable current source 33e causes change in the amplitude of the driving signal Vmod. Therefore, extinction ratio of the optical signal is adjusted by changing the current provided by the variable current source 33e, namely the adjustment current Imod.

The differential amplifier 33 outputs the driving signal Vmod to the output-side emitter follower 34. The output-side emitter follower 34 shifts the driving signal Vmod to a lower potential and outputs the shifted driving signal. The current source 34b provides an emitter current to the transistor 34a.

In the bypass circuit 35 (shunt circuit), the transistor 35a turns on/off in response to the shifted driving signal input from the output-side emitter follower 34 to the control terminal (base) of the transistor 35a. When the transistor 35a turns on, the bypass circuit 35 bypasses a part of the constant current Idc through itself. Here, the current bypassed by the bypass circuit 35 is called bypass current (or, shunt current). Therefore, the bypass circuit 35 subtracts the bypass current from the constant current Idc (direct current) and the subtraction decreases the current flows in the laser diode 23. The bypass current flows to the reference potential line 30e through the first and second current terminals (collector and emitter) of the transistor 35a and the resistor 35b. When the shifted driving signal becomes higher in potential, the bypass current becomes greater and the current flows in the laser diode 23 contrarily becomes smaller. Decrease in the current flows in the laser diode 23 causes decrease in the optical output power of the optical signal emitted from the laser diode 23. When the shifted driving signal becomes lower in potential, the bypass current becomes smaller and the current flows in the laser diode 23 contrarily becomes greater. Increase in the current flows in the laser diode 23 causes increase in the optical output power of the optical signal Ls emitted from the laser diode 23. Accordingly, the optical signal Ls is modulated by changing the shifted driving signal. This configuration enables the laser driver 22 to modulate the output signal Ls in response to the differential input signal INP, INN. This type of modulation system is called shunt driving system, in which the bypass current corresponds to an output current of the laser driver 22.

More specifically, the bypass circuit 35 is described. In the bypass circuit 35, the resistor 35b dominantly determines trans-conductance of the bypass circuit 35. When resistance of the transistor 35b is RE, the trans-conductance becomes 1/RE approximately. The driving signal Vmod is set to have a DC offset bias to prevent the transistor 35a from turning off even when the driving signal Vmod is in the low level. The setting of the DC offset bias allows the transistor 35a to amplify the shifted driving signal linearly without clipping of waveforms thereof. Under the condition of setting the DC offset bias above, a modulation current component Iout (mod) is superimposed into a DC component Iout(DC). The both components flow into the first current terminal (collector) of the transistor 35a. The first current terminal (collector) of the transistor 35a is connected with the anode of the laser diode 23. In this connection (shunt connection), the transistor 35a provides an output current Iout=Iout (mod)+Iout(DC) to the laser diode 23. Intensity modulation of the optical signal Ls originates from change in the modulation current component Iout(mod).

The DC component ILD(DC) that flows in the laser diode 23 is expressed as ILD(DC)=Idc−Iout (DC). When threshold current of the laser diode 23 is Ith, average power of the optical signal Pave is expressed as Pave=SLD*(Idc−Iout (DC)−Ith), where SLD is emission efficiency (slope efficiency) [unit: W/A] of the laser diode 23.

When the laser driver 22 drives the laser diode 23 under the condition described above, the filter 36 damps high frequency components of the output current Iout. Namely, the filter 36 bypasses the high frequency components of the output current Iout from the laser diode 23, so that frequency characteristics of the laser driver 22 is adjusted for obtaining preferable optical waveforms.

Here, stabilization of the average potential (common potential) of the driving signal Vmod will be described. As mentioned above, when the extinction ratio of the optical signal Ls is set to be a predetermined value, the adjustment current Imod provided by the variable current source 33e may be adjusted for changing amplitude of the driving signal Vmod. Hereat, change in the amplitude of the driving signal Vmod causes change in the average potential of the driving signal Vmod without any counter measures. The laser driver 22 according to the embodiment of the present invention includes the target potential circuit 37 and the adjusting circuit 38. The adjusting circuit 38 controls the variable resistor (the transistor 38a) so that the average potential Vcom of the driving signal Vmod is maintained substantially equal to the target potential Vtgt, namely a constant value.

The target potential circuit 37 according to the embodiment of the present invention includes the variable current source 37a, diode connection transistors 37b, 37c, and a resistor 37d, which constitute a series circuit provided between the power supply line 30b and the reference potential line 30e (GND line). In the series circuit, the same current flows from the power line 30b to the reference potential line 30e through the variable current source 37a, diode connection transistors 37b, 37c, and a resistor 37d. The diode connection transistor 37b has size equal to the emitter current density of the transistor 34a. The diode connection transistor 37c has a size equal to a size of the transistor 35a multiplied by a factor 1/n. The resistor 37d has a resistance equal to a resistance of the resistor 35b multiplied by a factor n. The target potential Vtgt is generated as sum of respective voltage drops of the diode connection transistors 37b, 37c, and a resistor 37d. In the configuration of the target potential circuit 37, the diode connection transistors 37b, 37c replicate the transistor 34a, 35a, respectively, and the resistor 37d replicates the resistor 35b. Thus, the target potential circuit 37 provides the target potential Vtgt that matches operational characteristics of the bypass circuit 35. The transistor 35a in the bypass circuit is maintained to operate linearly, even when magnitude of the driving signal Vmod is changed by adjusting the adjusting current Imod.

More specifically, in the target potential circuit 37, the current provided by the variable current source 37a (second current source) is set to the DC component Iout(DC) of the output current Iout multiplied by a factor 1/m (m is a real number greater than 1). At the same time, resistance of the resistor 37d is set to the resistance of the resistor 35b multiplied m. In this configuration, the potential Ve2 between the diode connection transistor 37c and the resistor 37d becomes substantially equal to the potential Ve1 between the transistor 35a and resistor 35b.

In addition, voltage drops of the diode connection transistors 37b, 37c may be almost the same with voltage drops of the transistors 34a, 35a, respectively, with slight difference. Such difference, however, is compensated by finely adjusting the factor 1/m to, for example, 1/m' (m' is a real number greater than 1), so that the target potential Vtgt is provided with better accuracy.

When the diode connection transistors 37b, 37c and the transistors 34a, 35a have almost the same voltage drop Vbe between base and emitter, the target potential Vtgt is expressed by a formula: Vtgt=2*Vbe+Iout(DC)/RE=2*Vbe+(Iout(DC)/m')*(m*RE).

In the adjustment circuit 38, the operational amplifier 38b receives the average potential Vcom of the driving signal Vmod at the non-inverting input terminal thereof, and receives the target potential Vtgt at the inverting input terminal thereof. Then, the operational amplifier 38b amplifies a potential difference between the average potential Vcom and the target potential Vtgt, and outputs a signal amplified from the potential difference to the control terminal (gate) of the transistor 38a. The transistor 38a, which is, for example, a p-type MOSFET, operates in a triode region thereof. For the transistor 38a, when the negative gate-source voltage Vgs=V(gate)−V(source), where V(gate) is a potential applied to the gate and V(source) is a potential applied to the source, is smaller than the negative threshold voltage Vth, namely the absolute value of Vgs is greater than the absolute value of Vth, a smaller Vgs causes a smaller resistance between the source and drain and a higher average potential Vcom, and reversely a larger Vgs causes a larger resistance between the source and drain and a lower average potential Vcom. Accordingly, the adjusting circuit 38 maintains the average potential Vcom to be substantially equal to the target potential Vtgt with the aforementioned feedback control, when amplitude of the driving signal Vmod is changed by adjusting the adjustment current Imod. In addition, the laser driver 22 may maintain a magnitude of the DC component Iout(DC) of the output current Iout in a constant value. The aforementioned configuration enables the laser driver 22 to maintain the average optical power of the optical signal Ls constant, while the extinction ratio of the optical signal LS is being adjusted.

FIGS. 4A, 4B, 5A, and 5B are graphs illustrating advantages according to the aforementioned embodiment of the present invention. These simulation results may be obtained, when potential of the power supply line, the target potential Vtgt, the resistance of the resistors 33c, 33d, the resistance of the resistor 35b, the DC component Iout(DC), the base-emitter voltage of the transistors 34a, 35a, 37b, and 37c, the constant current Idc (direct current), and the threshold current of the laser diode 23 are set to be 3V, 2V, 60Ω, 12Ω, 20 mA, 0.88 V, 60 mA, and 10 mA, respectively, and the transistor 35a operates linearly.

Figure 4A:
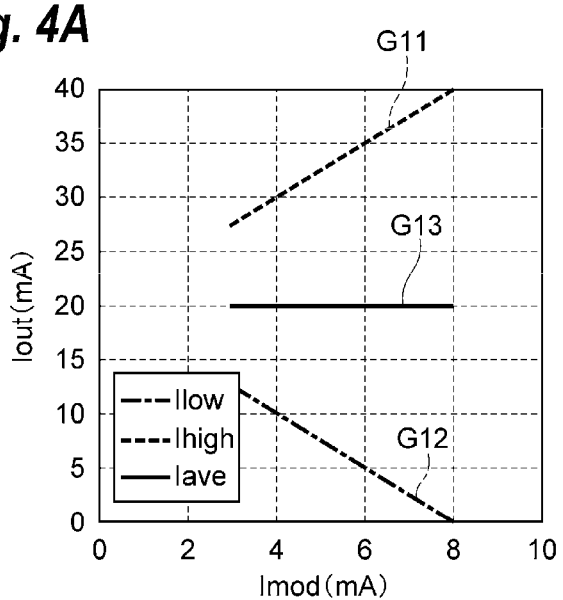
FIG. 4A is a graph representing dependence of an output current Iout on adjustment current Imod.

FIG. 4A is a graph illustrating dependence of the output current Iout on the adjustment current Imod from 3 mA to 8 mA. The line G11 corresponds to the current Ihigh defined as the output current Iout when the driving signal Vmod is set to be the high level thereof. The line G12 corresponds to the current Ilow defined as the output current Iout when the driving signal Vmod is set to be the low level thereof. Then, the line G13 corresponds to the average current Iave calculated by a formula: Iave=(Ihigh+Ilow)/2. As illustrated in FIG. 4A, when Imod increases from 3 mA to 8 mA, Ihigh increases and Ilow decreases, but Iave is maintained in a constant value (20 mA).

Figure 4B:
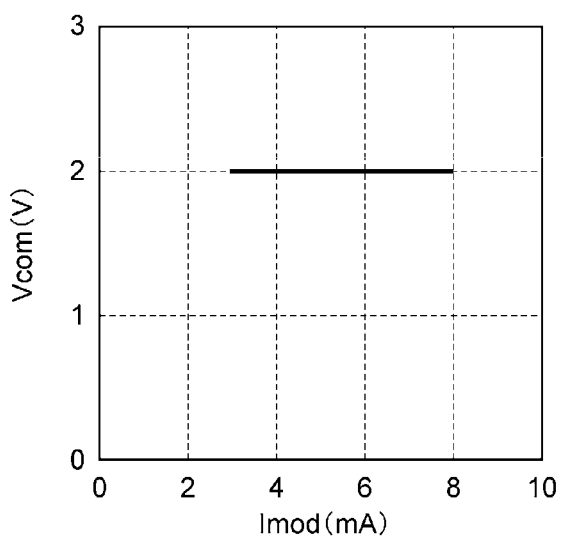
FIG. 4B is a graph representing dependence of average potential Vcom on the adjustment current Imod.

FIG. 4B is a graph illustrating dependence of the average potential Vcom on the adjustment current Imod from 3 mA to 8 mA. As shown in FIG. 4B, Vcom becomes flat at 2V.

Figure 5A:
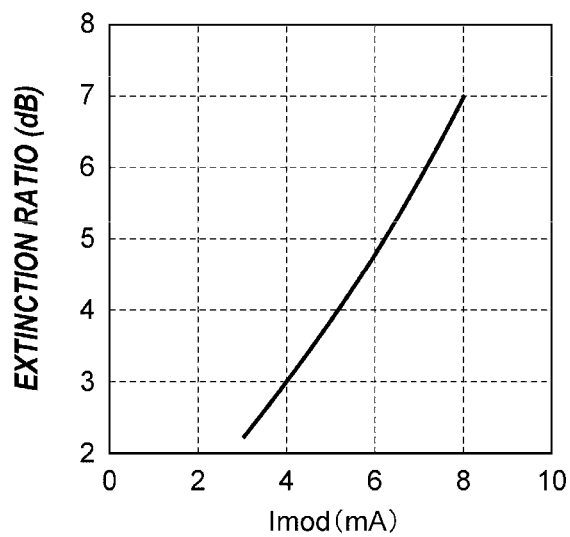
FIG. 5A is a graph representing dependence of an extinction ratio on an optical signal Ls on the adjustment current Imod.

FIG. 5A is a graph representing dependence of an extinction ratio ER of the optical signal Ls on the adjustment current Imod from 3 mA to 8 mA. The extinction ratio ER is calculated by a formula: ER=10*log 10[(Idc−Ilow−Ith)/(Idc−Ihigh−Ith)]. As illustrated in FIG. 5A, when the Imod increases, the extinction ratio ER glows largely.

Figure 5B:
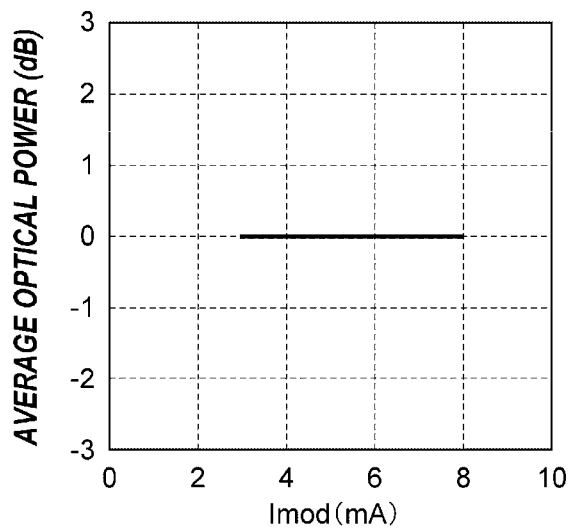
FIG. 5B is a graph representing dependence of average optical power on the adjustment current Imod.

FIG. 5B is a graph illustrating dependence of the average optical power Pave on the adjustment current Imod from 3 mA to 8 mA. As shown in FIG. 5B, Pave becomes flat at 0 dB.

As illustrated in FIGS. 4A, 4B, 5A, and 5B, in the laser driver 22 according to the embodiment of the present invention, the extinction ratio ER may be variable from 2 dB to 7 dB by adjusting Imod from 3 mA to 8 mA with the average optical power Pave maintained in a constant value. As the adjustment circuit 38 maintains the average potential Vcom, which corresponds to the average optical power Pave, in a constant value, the laser driver 22 simplifies an adjustment work of the extinction ratio ER by maintaining the average optical power constant, because change in the adjustment current Imod causes change in only one parameter, the extinction ratio ER.

To describe advantages according to the aforementioned embodiment of the present invention, the laser diver without the target potential circuit 37 and the adjusting circuit 38 will be described below as a comparable example. In such a laser driver, when the modulation amplitude is changed for adjusting the extinction ratio ER, the average optical power of the optical signal also moves at the same time. Therefore, the adjustment of the extinction ratio ER with the average optical power kept constant needs a complex operation. For the comparable example described below, it is supposed that given values of the related circuit parameters, for example, supply voltage, resistances, and characteristics of transistors are identical to those of the laser driver according to the embodiment of the present invention.

Figure 6A:
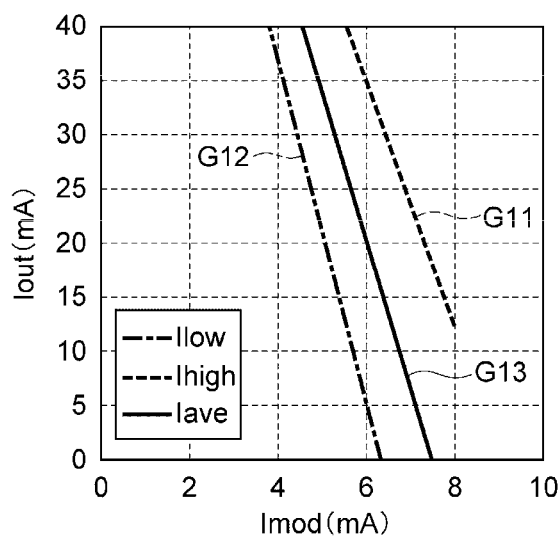
FIG. 6A is a graph representing dependence of output current Iout on the adjustment current Imod according to a comparative example of the present invention.

FIG. 6A is a graph illustrating dependence of the output current Iout on the adjustment current Imod from 4 mA to 8 mA for the laser driver of the comparable example. As illustrated in FIG. 6A, All of Ihigh, Iloa, and Iave decreases steeply with increase in Imod. Such strong dependence originates from instability of the average potential Vcom against the adjustment current Imod as described next.

Figure 6B:
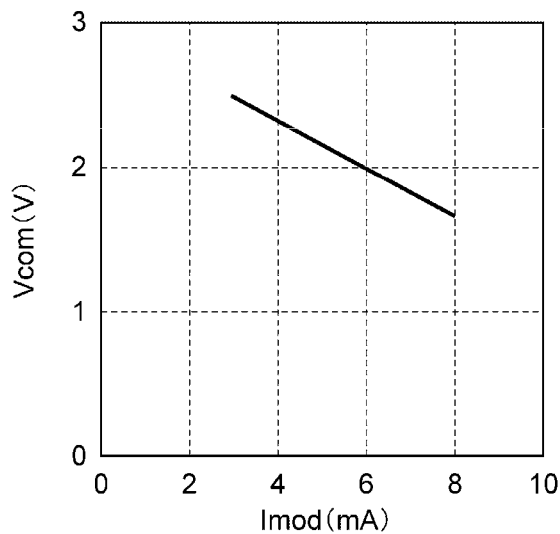
FIG. 6B is a graph representing dependence of average potential Vcom on the adjustment current Imod according to the comparative example.

FIG. 6B is a graph illustrating dependence of the average potential Vcom on the adjustment current Imod from 3 mA to 8 mA or the laser driver of the comparable example. As illustrated in FIG. 6B, the average potential Vcom degrades, when the adjustment current Imod increases.

Figure 7A:
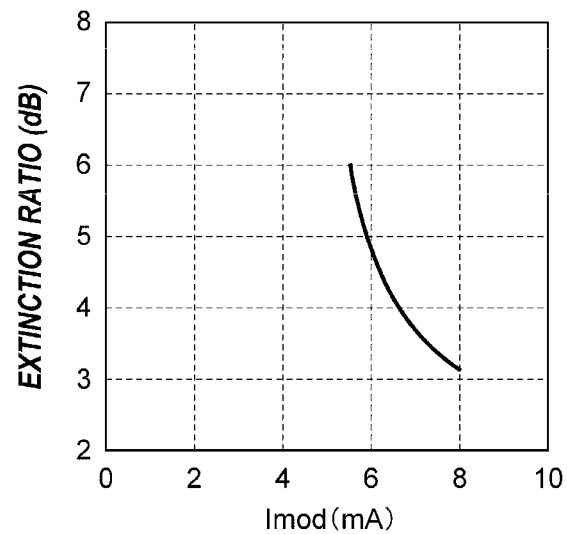
FIG. 7A is a graph representing dependence of an extinction ratio of an optical signal on the adjustment current Imod according to the comparative example.

FIG. 7A is a graph representing dependence of the extinction ratio ER of the optical signal Ls on the adjustment current Imod from 5.5 mA to 8 mA for the optical transmitter of the comparable example. The extinction ratio ER changes from 6 dB to 3 dB by increasing the adjustment current Imod. Therefore, the adjustment of the extinction ratio may be possible. For the adjustment current Imod smaller than 6 mA, the slope (derivative) of the extinction ratio ER increases with decrease in the adjustment current Imod.

Figure 7B:
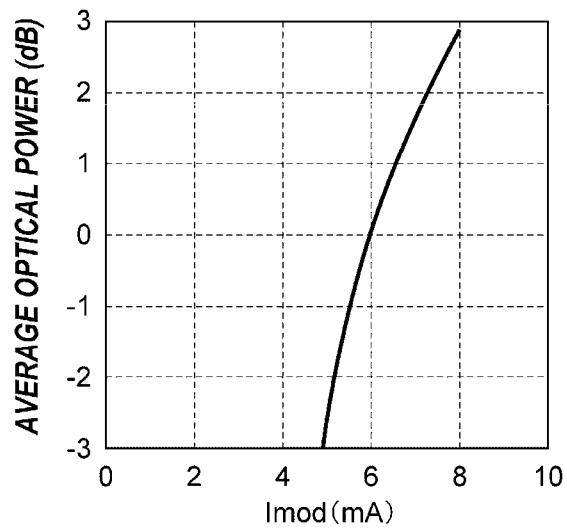
FIG. 7B is a graph representing dependence of average optical power on the adjustment current Imod according to the comparative example.

FIG. 7B is a graph illustrating dependence of the average optical power Pave on the adjustment current Imod from 5 mA to 8 mA for the optical transmitter of the comparable example. The unit of the average optical power (the vertical axis) is normalized for the value at the adjustment current Imod of 6 mA. As illustrated in FIG. 7B, in a relatively small range of about 2 mA around the 6 mA of the adjustment current Imod, the average optical power Pave drastically changes from −3 dB to +3 dB. Such a large slope often deteriorates controllability and accuracy of the adjustment.

Meanwhile, for the laser driver of the comparable example, replacing the constant current source 20 with a variable current source and adding a current control circuit for adjusting the current Idc provided by the variable current source is considered as another measure for maintaining the average optical power constant. The current control circuit will detect temperature change of the laser diode 23 and degradation of the average optical power by aging, and adjust the current Idc and the adjustment current Imod to keep the average optical power Pave in a constant value. However, as illustrated in FIG. 6A, the output current Iout has very steep slopes against the adjustment current Imod. In addition, if Ilow (the line G12) reaches 0 mA, the laser driver hardly continues linear amplification, because the low side of the waveforms is clipped and the output current is distorted. Accordingly, the current control circuit will struggle against a very narrow adjustable range of the adjustment current Imod.

As described above, in the laser driver of the comparable example, the adjustment of the adjustment current Imod for adjusting the extinction ratio ER causes change in the average optical Pave. In practice, however, it is preferable for the average optical power Pave to be kept in a determined value, when the modulation current component Iout (mod) is changed.

Furthermore, adding a current control circuit to the laser driver for maintaining the average optical power constant may not improve the very narrow adjustable range of the output current Imod but also increase total size of the laser driver, which will be disadvantage in view of downsizing of the optical transmitter. The laser driver 22 according to the embodiment of the present invention is configured to provide a wide adjustable range of the output current for adjusting the extinction ratio ER and stability of the average optical power, which make the adjustment operation easy. Namely, the laser driver 22 enables the easy adjustment of the extinction ratio ER under the condition that the average optical power is maintained constant, without adding a large-scale and complicated control circuit.

Figure 8A:
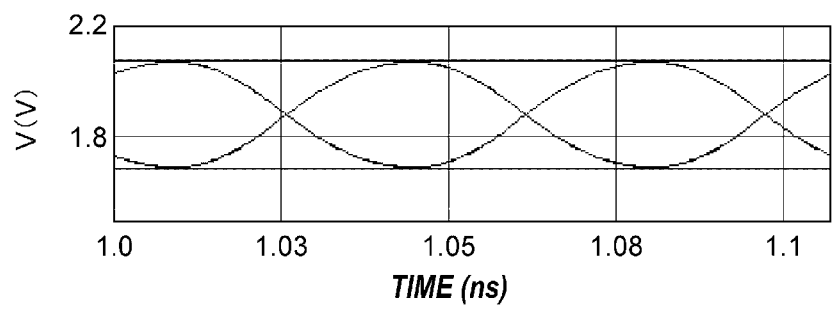
FIGS. 8A and 8B are graphs representing waveforms of a conventional shunt driver operating in a linear operation region.
Figure 8B:
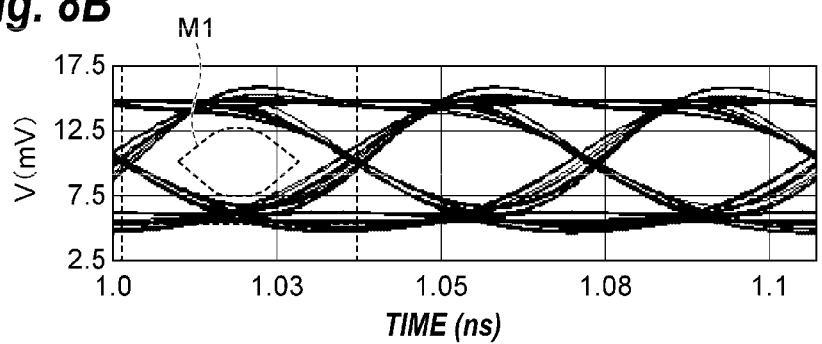
Figure 9A:
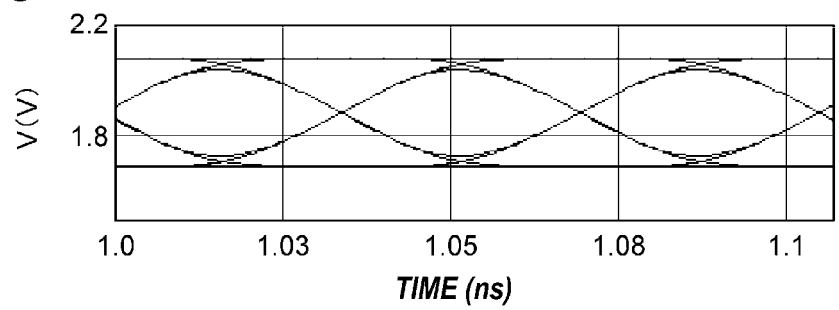
FIGS. 9A and 9B are graphs representing waveforms of the conventional shunt driver operating in a linear operation region.
Figure 9B:
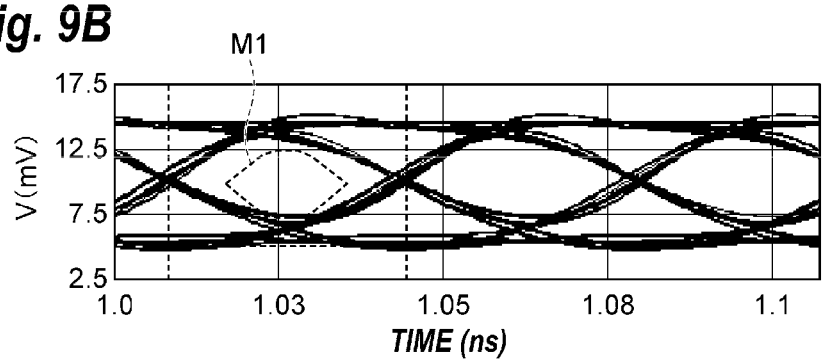
Figure 10A:
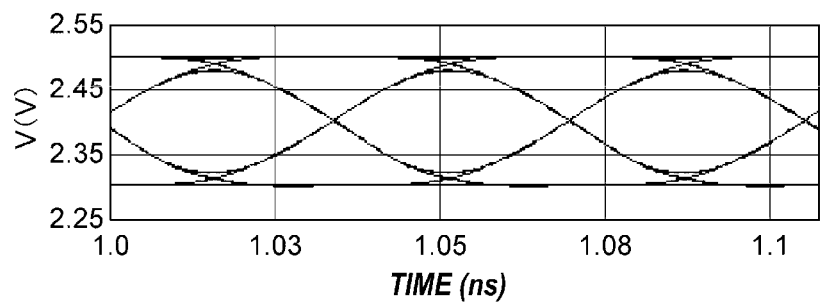
FIG. 10A to 10C are graphs representing waveforms of the laser driver according to the embodiment of the present invention.

Next, with reference to FIGS. 8A to 10C, advantage of the differential input signal (i.e. the positive-phase input signal INP and the negative-phase input signal INN) with amplitude larger than the linear operation range of the differential amplifier 33 is described as follows. FIG. 8A represents waveforms of the differential input signal in a conventional shunt driver operating in a linear amplification region. FIG. 8A shows a relatively small rise time tr of 12 ps at the transition from 20% to 80% in amplitude and also a relatively small fall time of 12 ps at the transition from 80% to 20% in amplitude. FIG. 9A represents similar waveforms of the differential input signal in a conventional shunt driver operating in a linear amplification region. However, in FIG. 9A, the rise and fall times have relatively large values, namely, about 16 ps. FIG. 10A represents waveforms of the differential input signal in the laser driver 22 according to the embodiment of the present invention. In FIG. 10A, the rise and fall times also have a relatively large value, namely, about 16 ps. In FIGS. 8A to 10C, the modulation rate (symbol rate) of the signals is 28 Gbit/s.

Figure 10B:
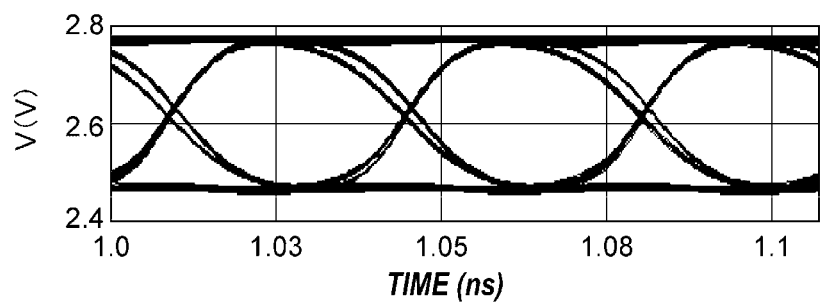
Figure 10C:
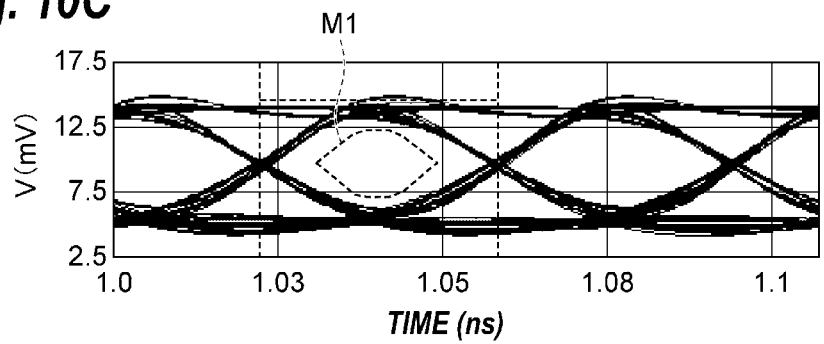

FIGS. 8A, 9A, and 10A represent eye patterns (waveforms) of the differential input signal. FIGS. 8B, 9B, and 10C represent eye patterns of the optical signal output from the laser diode 23, in each of which the unit of the vertical axis is converted to voltage. FIG. 10B represents an eye pattern of the driving signal Vmod.

As shown in FIG. 8B, when the rise and fall times of the differential input signal are relatively small values, for example, 12 ps, the optical signal has a good eye opening, which is wider than the pulse musk M1 defined by a related standard. As shown 9B, however, when the rise and fall times are degraded to 16 ps, the eye opening becomes narrower, so that some traces can overlap the pulse musk M1. Such overlapping means that the optical signal does not meet the quality required in the related standard. Actually, error rate in the optical receiver that receives the optical signal shown in FIG. 9B will increase. Compared to this, even when the rise and fall times are degraded to 16 ps, the laser driver according to the embodiment of the present invention improves the rise and fall times by clipping the high level and low level of the driving signal Vmod, so that waveforms of the optical signal is reproduced like waveforms of the differential input signal before traveling the lossy transmission line. Accordingly, the improved rise and fall times of the optical signal Ls causes wider (better) eye opening of the optical signal Ls, which have no overlap with the pulse musk M1.

[A Variation of the Embodiment According to the Present Invention]

Figure 11:
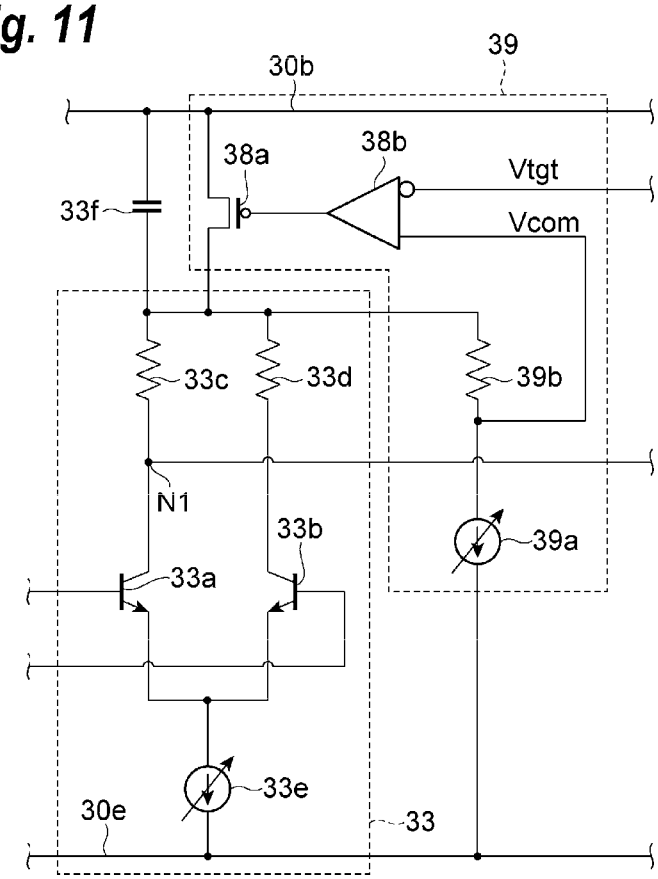
FIG. 11 is a circuit diagram of an adjusting circuit according to a variation of the embodiment of the present invention.

FIG. 11 is a circuit diagram of an adjusting circuit according to a variation of the embodiment of the present invention. The laser driver 22 according to the aforementioned embodiment of the present invention may use the adjusting circuit 39 of this variation instead of the adjusting circuit 38 of the aforementioned embodiment.

The adjusting circuit 39 illustrated in FIG. 11 further includes a variable current source 39a and a resistor 39b, in comparison with the adjusting circuit 38. The variable current source 39a is connected in series with the resistor 39b. A series circuit that the variable current source 39a and the resistor 39b constitute is connected in parallel with the differential amplifier 33, which includes the parallel circuit constituted of the transistors 33a, 33b and the resistors 33c, 33d and the variable current source 33e connected in series with the parallel circuit. More specifically, one end of the resistor 39b is connected with the second ends of the resistors 33c, 33d, and the other end of the resistor 39b is connected with a first end of the variable current transistor 39a. A second end of the variable current source 39a in connected with the reference potential line 30e.

In the adjusting circuit 39, the variable current source 39a may provide a current, whose value is substantially equal to the current provided by the variable current source 33e multiplied by a factor 1/m, where m is a real number greater than 1. The resistor 39b may have a resistance equal the resistance of the resistors 33c, 33d multiplied by a factor m/2. In this configuration, the voltage drop of the resistor 39b becomes equal to an average (center value) of the maximum and minimum values of the voltage drops of the resistor 33c, 33d. Accordingly, the average potential Vcom is generated at the node between the resistor 39b and the variable current source 39a. Namely, the potential at the second end of the resistor 39b is input to the non-inverting input terminal of the operational amplifier 38b, as the average potential Vcom.

The adjusting circuit 39 of the variation may appropriately provide the average potential Vcom of the driving signal Vmod as well as the aforementioned adjusting circuit 38. In addition, the average potential Vcom is generated by the simple configuration constituted of only one resistor and one variable current source.

The laser driver according to the embodiment of the present invention should not be limited to the aforementioned specific configurations, and other variation and transformation are possible. For example, although the transistors 32a1, 32b1, 33a, 33b, 34a, 35a, 37b, and 37c are bipolar transistors in the aforementioned specific configurations, some of them may be replaced with FETs. In the replacement, the control terminal, the first current terminal, and the second terminal of the transistor correspond to gate, drain, and source of the FET, respectively. In addition, the target potential circuit and the adjusting circuit should not limited to the aforementioned specific configuration, and other variation and transformation are possible. The other similar configurations to generate the target potential Vtgt and decrease difference between the target potential Vtgt and the average potential Vcom by feedback control of the variable resistor are also adoptable.

For example, in the differential amplifier 33, a cascade transistor may be added between the node N1 and the transistor 33a (in one of the series circuits), and another cascade transistor may be added between the node N2 and the transistor 33b (in the other of the paired series circuit), in order to improve high speed performance of the differential amplifier 33. In addition, the output-side emitter follower 34 may have a first-stage emitter follower and a second-stage emitter follower that is connected in cascade with the first-stage emitter follower as a two-stage configuration. When the two-stage configuration is applied to the output-side emitter follower 34, the target potential circuit 37 may further include a diode connection transistor, which replicates the transistor in the second-stage emitter follower.

What is claimed is:

1. A laser driver for generating a driving current for a semiconductor laser element in response to a differential input signal, the semiconductor laser element receiving a direct current from a direct current source connected in series with the semiconductor laser element, the laser driver comprising:
  a differential amplifier including:
    an upper node,
    a lower node connected to a reference potential line,
    a first current source to provide a first source current flowing in the lower node;
    a pair of first resistors each having a first end and second end, the first ends of the first resistors being connected with the upper node, the second end of one of the first resistors outputting a driving signal, the second end of another of the first resistors outputting a reverse driving signal having a phase opposite to a phase of the driving signal, and a pair of first transistors configured to divide the first source current into a first current and a second current in response to the differential input signal, the first current flowing in the second end of the one of the first resistors, the second current flowing in the second end of the another of the first resistors, a target potential circuit configured to generate a target potential;

an adjusting circuit including a variable resistor connected between a power supply line and the upper node of the differential amplifier, the adjusting circuit being configured to adjust resistance of the variable resistor so as to reduce a difference between the target potential and a center potential between the driving signal and the reverse driving signal; and a bypass circuit connected in parallel with the semiconductor laser element, the bypass circuit being configured to output an output current in response to the driving signal;

wherein the driving current is generated by subtracting the output current from the direct current.

2. The laser driver according to claim 1,
wherein the bypass circuit includes a second transistor and a second resistor, the second transistor outputting the output current in response to the driving signal, the second resistor being connected between the second transistor and the reference potential line,
wherein the target potential circuit includes a second current source connected with the power supply line, a diode connection transistor connected in series with the second current source, and a third resistor connected between the diode connection transistor and the reference potential line,
wherein the diode connection transistor has a size substantially equal to a size of the second transistor multiplied by a factor 1/n, where n is a real number,
wherein the third resistor has a resistance substantially equal to a resistance of the second resistor multiplied by a factor n,
wherein the second current source provides a second source current flowing through the diode connection transistor and the third resistor, the second source current substantially equal to the first source current multiplied by the factor 1/n, and
wherein the target potential is generated by a sum of respective voltage drops of the diode connection transistor and the third resistor.

3. The laser driver according to claim 1,
wherein the adjusting circuit includes a second resistor connected with the upper node of the differential amplifier, and a second current source connected between the second resistor and the reference potential line,
wherein the second current source provides a second source current substantially equal to the first source current multiplied by a factor 1/m, where m is a real number, the second current flowing in the second resistor,
wherein the second resistor has a resistance substantially equal to a resistance of the first resistors multiplied by a factor m/2, and,
wherein the center potential between the driving signal and the reverse driving signal is generated at a node connected between the second resistor and the second current source.

4. The laser driver according to claim 1,
wherein the adjusting circuit further includes a pair of second resistors each having a first end and a second end, the first end of one of the second resistors receives the driving signal, the first end of another of the second resistors receives the reverse driving signal, the second ends of the second resistors are connected with each other at a center node, and
wherein the center potential between the driving signal and the reverse driving signal is generated at the center node.

5. The laser driver according to claim 1,
wherein the variable resistor includes a p-type MOSFET having gate, source, and drain, the source being connected with the power supply line, the is the drain being connected with the upper node of the differential amplifier, and
wherein the adjusting circuit adjusts a potential applied to the gate so as to reduce a difference between the target potential and the center potential between the driving signal and the reverse driving signal.

6. The laser driver according to claim 1,
wherein the adjusting circuit further includes an operational amplifier having a non-inverting input terminal, an inverting input terminal, and an output terminal,
wherein the non-inverting input terminal receives the center potential between the driving signal and the reverse driving signal,
wherein the inverting input terminal receives the target potential, and
wherein the operational amplifier outputs a control signal from the output terminal thereof for controlling the variable resistor in response to a potential difference between the non-inverting input terminal and the inverting terminal.

\* \* \* \* \*